United States Patent
Liu et al.

(10) Patent No.: US 9,136,330 B2
(45) Date of Patent: Sep. 15, 2015

(54) SHALLOW TRENCH ISOLATION

(71) Applicant: GLOBALFOUNDRIES Inc., Grand Cayman (KY)

(72) Inventors: Yanxiang Liu, Glenville, NY (US); Johannes M. van Meer, Newburgh, NY (US); Xiaodong Yang, Hopewell Junction, NY (US); Manfred J. Eller, Beacon, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 13/947,439

(22) Filed: Jul. 22, 2013

(65) Prior Publication Data

US 2015/0021702 A1 Jan. 22, 2015

(51) Int. Cl.
*H01L 29/49* (2006.01)
*H01L 29/06* (2006.01)
*H01L 21/762* (2006.01)

(52) U.S. Cl.
CPC ...... *H01L 29/0653* (2013.01); *H01L 21/76224* (2013.01)

(58) Field of Classification Search
CPC .............. H01L 21/76224; H01L 29/0653
USPC .............. 257/213, 77, 369, 190, E21.632
See application file for complete search history.

(56) References Cited

U.S. PATENT DOCUMENTS

| | | | |
|---|---|---|---|
| 5,447,884 A | 9/1995 | Fahey et al. | |
| 6,998,666 B2 | 2/2006 | Beintner et al. | |
| 2007/0235770 A1* | 10/2007 | Ting et al. | 257/213 |
| 2011/0084355 A1* | 4/2011 | Lin et al. | 257/506 |
| 2013/0037821 A1* | 2/2013 | Wang et al. | 257/77 |
| 2013/0037822 A1* | 2/2013 | Yin et al. | 257/77 |

\* cited by examiner

*Primary Examiner* — Michael Shingleton
(74) *Attorney, Agent, or Firm* — Williams Morgan, P.C.

(57) ABSTRACT

A semiconductor structure with an improved shallow trench isolation (STI) region and method of fabrication is disclosed. The STI region comprises a lower portion filled with oxide and an upper portion comprising a high Young's modulus (HYM) liner disposed on the lower portion and trench sidewalls and filled with oxide. The HYM liner is disposed adjacent to source-drain regions, and serves to reduce stress relaxation within the shallow trench isolation (STI) oxide, which has a relatively low Young's modulus and is soft. Hence, the HYM liner serves to increase the desired stress imparted by the embedded stressor source-drain regions, which enhances carrier mobility, thus increasing semiconductor performance.

8 Claims, 6 Drawing Sheets

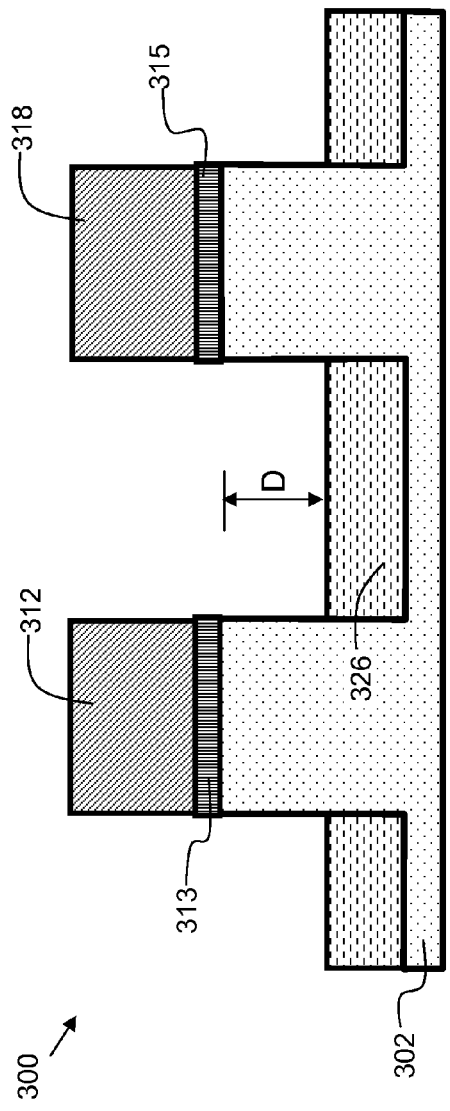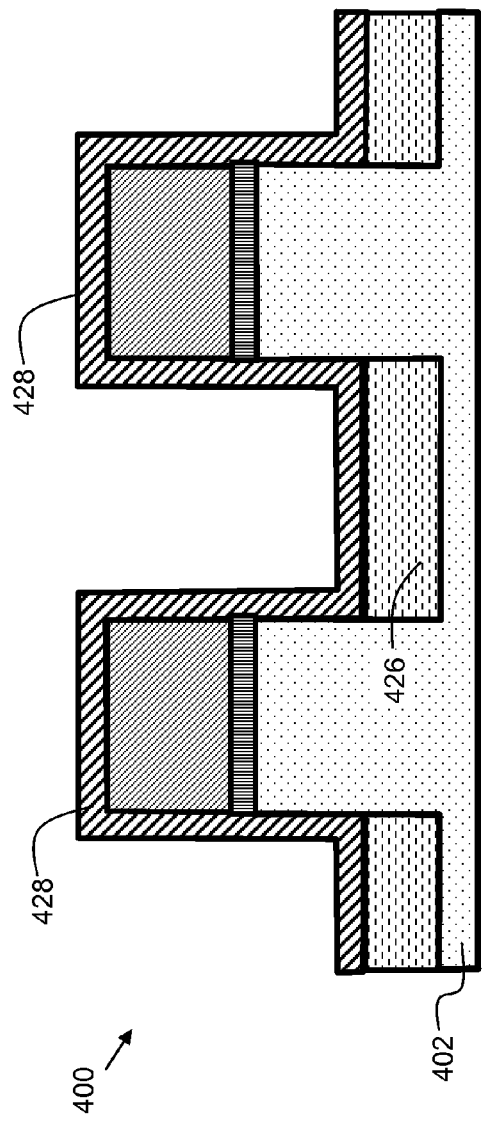

— SHALLOW TRENCH ISOLATION —

FIELD OF THE INVENTION

The present invention relates generally to semiconductors, and more particularly to an improved shallow trench isolation structure and methods of fabrication.

BACKGROUND

Classical semiconductor scaling, typically known as a device shrink, is currently supplemented by embedded stress engineering, using techniques such as stress memorization, or carbon-doped Si for an N-type field effect transistor (NFET) and SiGe for a P-type field effect transistor (PFET). With circuits becoming smaller and faster, improvement in device drive current is becoming more important. Drive current is closely related to gate length, gate capacitance, and carrier mobility. Embedded stressors are being used to speed carrier mobility in transistor channels, enabling higher drive currents.

Stress or strain in a device may have components in three directions, parallel to the metal-oxide-semiconductor (MOS) device channel length, parallel to the device channel width, and perpendicular to the channel plane. The strains parallel to the device channel length and width are called in-plane strains. Research has revealed that a bi-axial in-plane, or uni-axial along the channel length direction tensile strain, can improve NMOS (n-channel MOS transistor) performance, and compressive strain parallel to channel length direction can improve PMOS (p-channel MOS transistor) device performance.

For example, NFET transistor performance may be enhanced by stress memorization technique (SMT). In SMT, the NFET active region is amorphized by Ge, Si or Xe implant, then a capping layer is formed over the NFET, it is annealed, (i.e., the transistor is heated to a high temperature, which may be around 650° C. in some embodiments, and then cooled), and the capping layer is removed. The capping layer confines the volume change from amorphized silicon to crystallized silicon during thermal anneal and causes the formation of stacking faults at the NFET active region. These stacking faults induce tensile stress along the channel. As stress is an important factor in transistor performance, it is therefore desirable to have improvements in shallow trench isolation that enhance the effectiveness of stressor regions in a transistor.

SUMMARY

In a first aspect, embodiments of the present invention provide a semiconductor structure comprising: a semiconductor substrate; a first field effect transistor formed on the semiconductor substrate; a second field effect transistor formed on the semiconductor substrate adjacent to the first field effect transistor with a shallow trench isolation region formed in the semiconductor substrate and disposed between the first field effect transistor and the second field effect transistor; and a high Young's modulus liner disposed in the shallow trench isolation region and in contact with the first field effect transistor and the second field effect transistor.

In a second aspect, embodiments of the present invention provide a method of forming a semiconductor structure, comprising: forming a shallow trench isolation cavity on the semiconductor structure; depositing a first fill oxide in the shallow trench isolation cavity; recessing the first fill oxide; depositing a high Young's modulus liner on an interior surface of the shallow trench isolation cavity; and depositing a second fill oxide in the shallow trench isolation cavity In a third aspect, embodiments of the present invention provide a method of forming a semiconductor structure, comprising: forming a first field effect transistor and a second field effect transistor on a semiconductor substrate; forming a shallow trench isolation cavity between the first field effect transistor and the second field effect transistor; depositing a first fill oxide in the shallow trench isolation cavity; recessing the first fill oxide; depositing a high Young's modulus liner via atomic layer deposition on an interior surface of the shallow trench isolation cavity; and depositing a second fill oxide in the shallow trench isolation cavity.

BRIEF DESCRIPTION OF THE DRAWINGS

The structure, operation, and advantages of the present invention will become further apparent upon consideration of the following description taken in conjunction with the accompanying figures. The figures are intended to be illustrative, not limiting.

Often, similar elements may be referred to by similar numbers in various figures of the drawing, in which case typically the last two significant digits may be the same, the most significant digit being the number of the drawing figure. Furthermore, for clarity, some reference numbers may be omitted in certain drawings.

Figure 1:
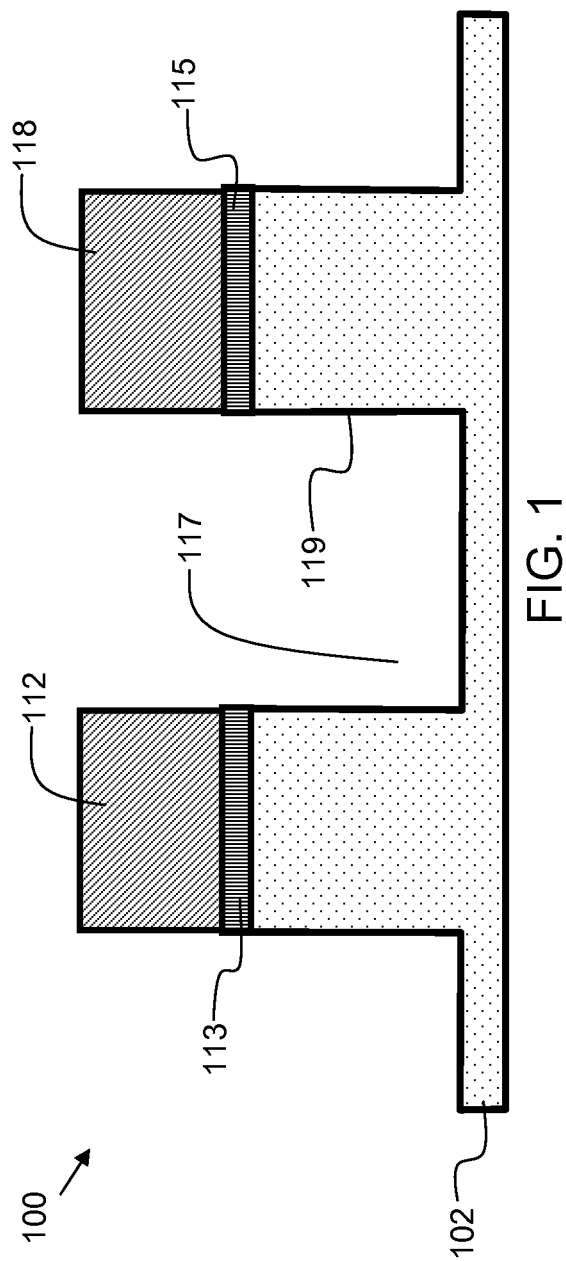
Figure 2:
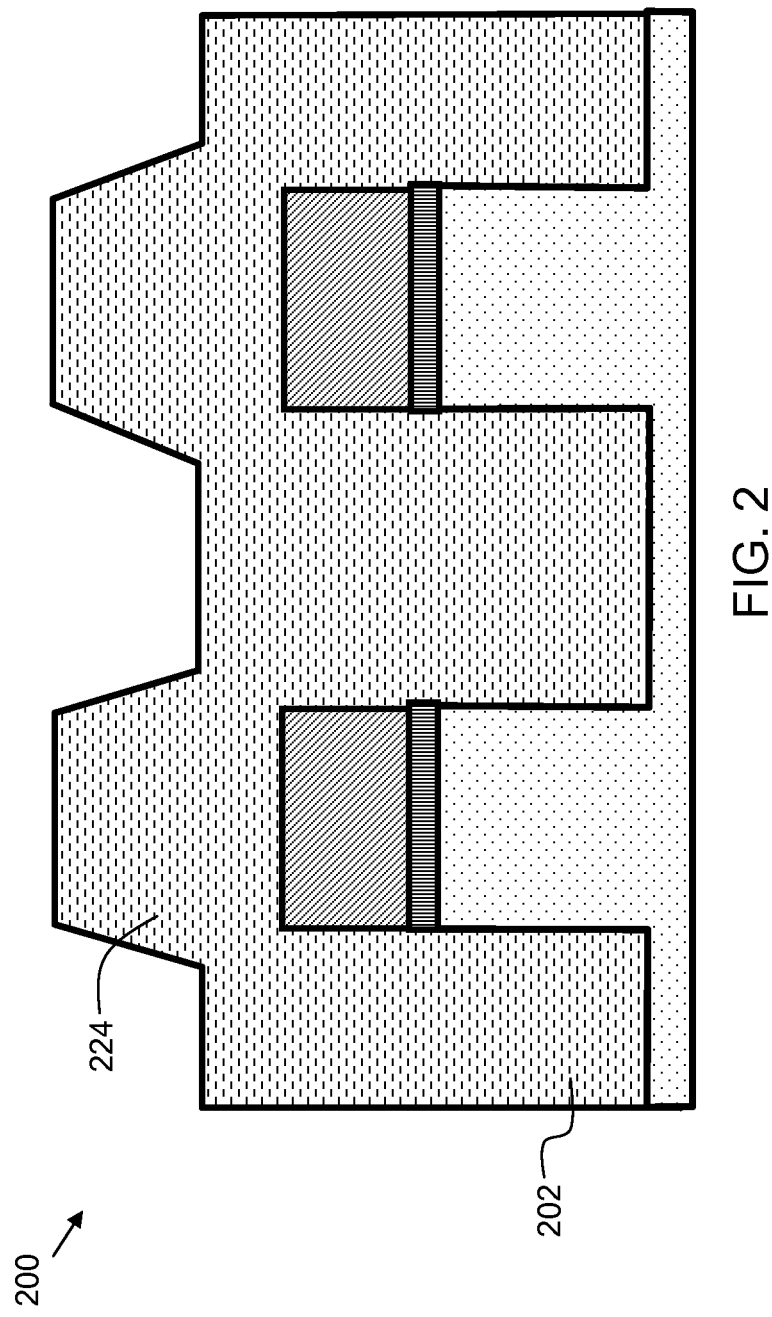
Figure 5:
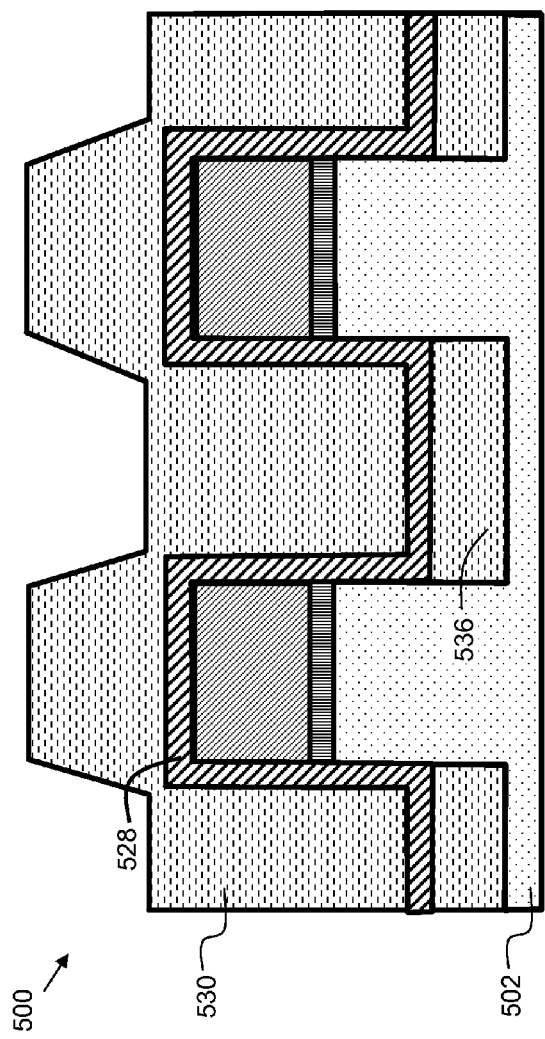
Figure 6:
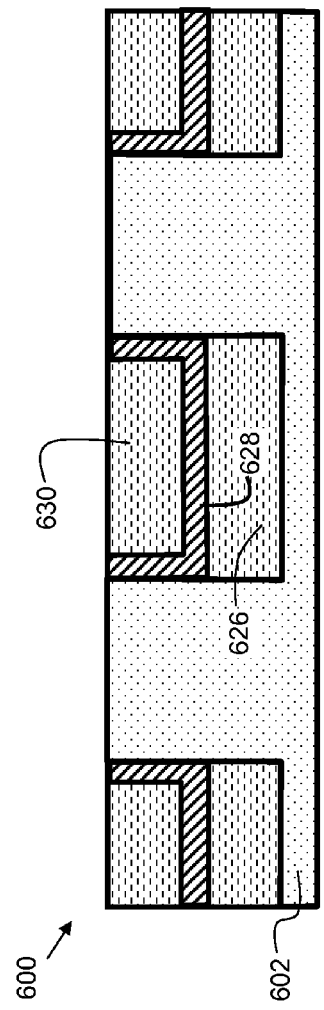
Figure 7:
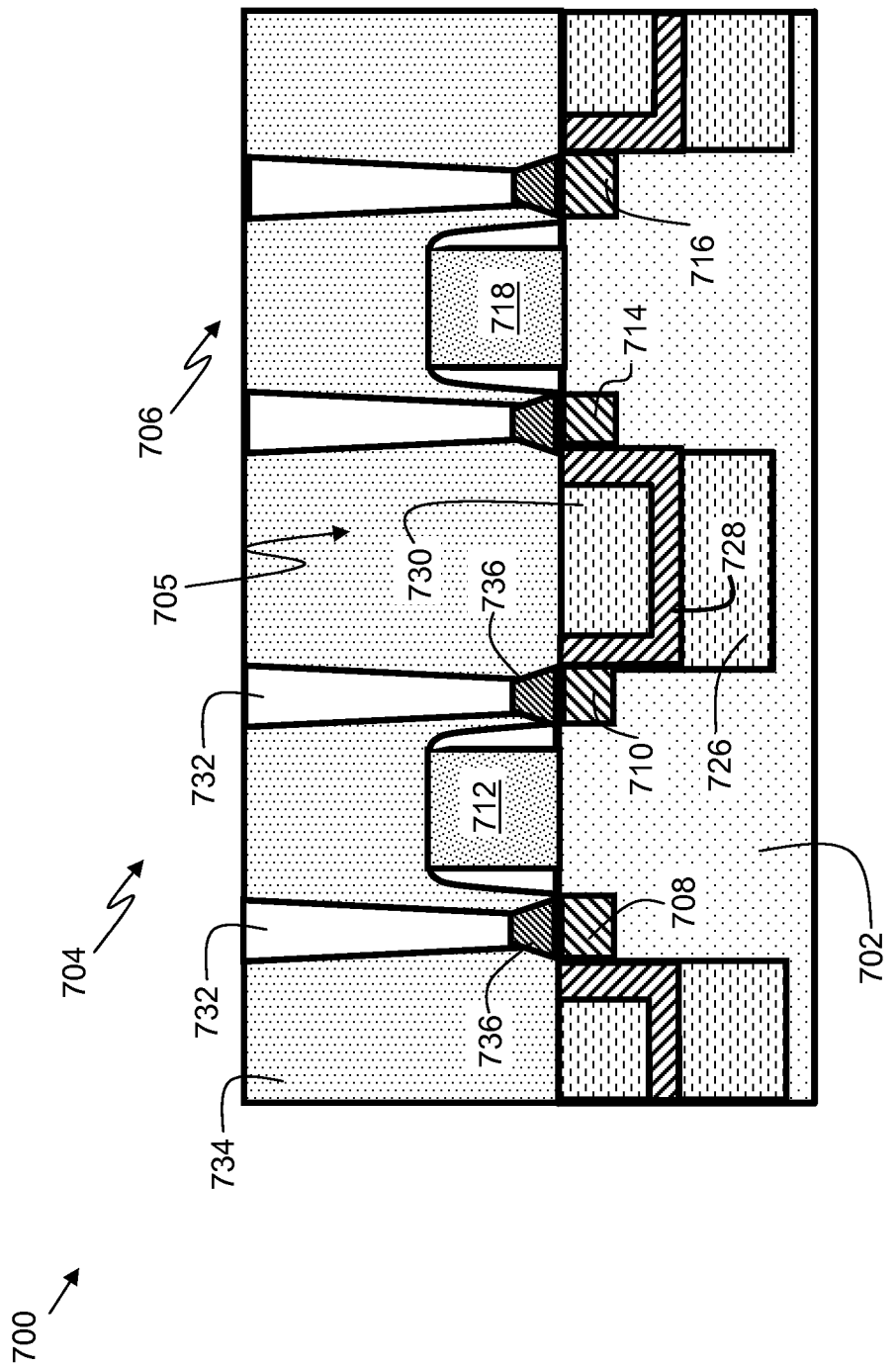
Figure 8:
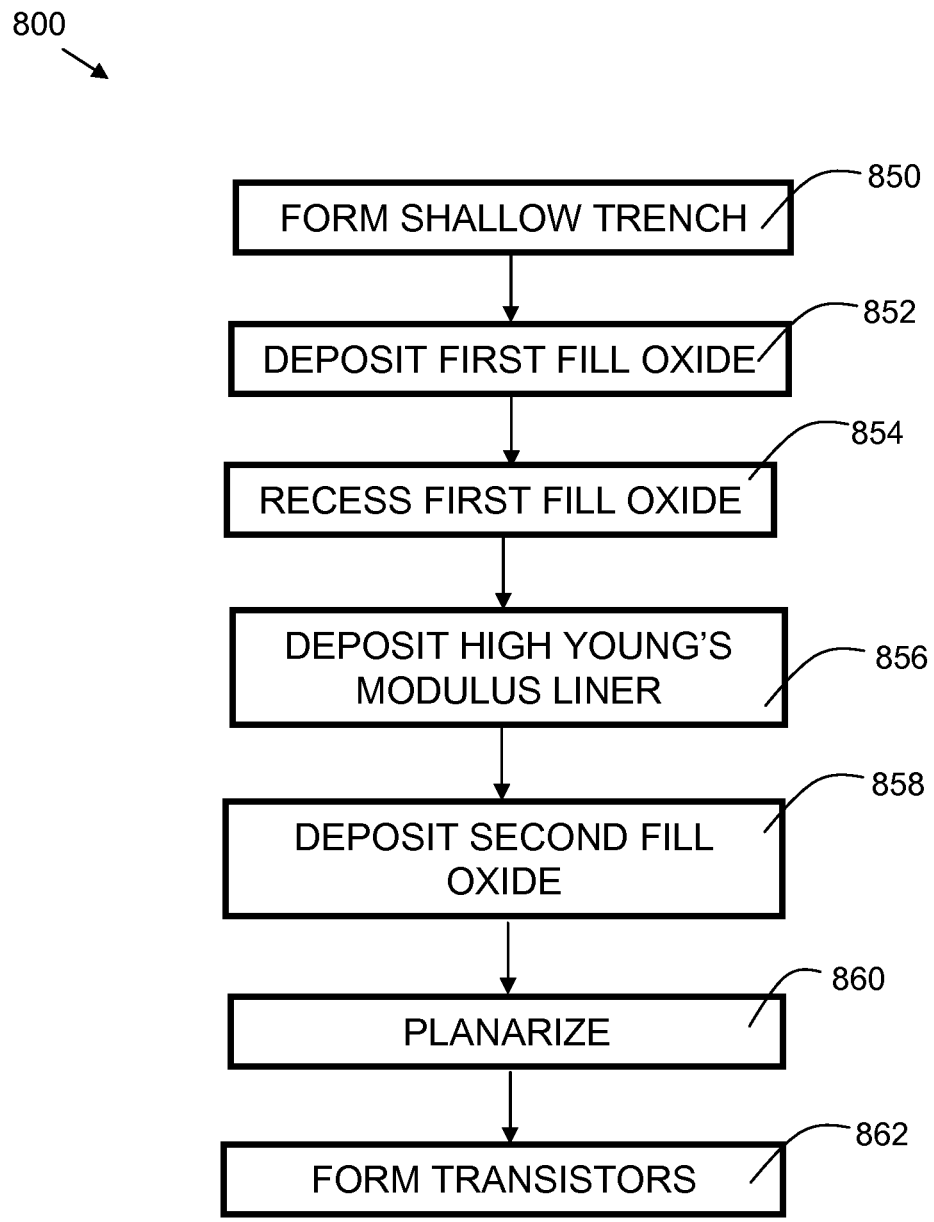

Features of this invention will be more readily understood from the following detailed description of the various aspects of the invention taken in conjunction with the accompanying drawings in which:

FIG. 1 shows a semiconductor structure at a starting point for illustrative embodiments;

FIG. 2 shows a semiconductor structure after a subsequent process step of depositing a first fill oxide in accordance with illustrative embodiments;

FIG. 3 shows a semiconductor structure after a subsequent process step of performing an oxide recess in accordance with illustrative embodiments;

FIG. 4 shows a semiconductor structure after a subsequent process step of depositing a high Young's modulus liner on the semiconductor structure;

FIG. 5 shows a semiconductor structure after a subsequent process step of depositing a second fill oxide in accordance with illustrative embodiments;

FIG. 6 shows a semiconductor structure after a subsequent process step of planarizing the structure in accordance with illustrative embodiments;

FIG. 7 shows a semiconductor structure after a subsequent process step of transistor formation, in accordance with illustrative embodiments; and FIG. 8 is a flowchart indicating process steps for embodiments of the present invention.

DETAILED DESCRIPTION

Exemplary embodiments will now be described more fully herein with reference to the accompanying drawings, in which exemplary embodiments are shown. Embodiments of the present invention provide a semiconductor structure with an improved shallow trench isolation (STI) region and method of fabrication. The STI region comprises a lower portion filled with oxide and an upper portion comprising a high Young's modulus (HYM) liner disposed on the lower portion and trench sidewalls and filled with oxide. The HYM liner is disposed adjacent to source-drain regions, and serves to reduce stress relaxation within the shallow trench isolation (STI) oxide, which has a relatively low Young's modulus and is soft. Hence, the HYM liner serves to increase the desired stress imparted by the embedded stressor source-drain regions, which enhances carrier mobility, thus increasing semiconductor performance. The HYM liner is only deposited in the upper portion of the STI region, avoiding the challenges of depositing the HYM liner deep into the STI trench.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

FIG. 1 shows a semiconductor structure 100 at a starting point for illustrative embodiments. A semiconductor substrate 102 serves as the base of structure 100. In embodiments, semiconductor substrate 102 may comprise a silicon substrate. Thin pad oxide regions 113 and 115 are formed on regions of substrate 102. The pad oxide serves reduce stress between the substrate 102 and pad nitride regions 112 and 118 that are formed on substrate 102, where transistors will be subsequently formed. A shallow trench isolation cavity 117 formed between pad nitride region 112 and pad nitride region 118. Shallow trench isolation cavity 117 has interior surface 119.

FIG. 2 shows a semiconductor structure 200 after a subsequent process step of depositing a first fill oxide 224 in accordance with illustrative embodiments. As stated previously, similar elements may be referred to by similar numbers in various figures (FIGs) of the drawing, in which case typically the last two significant digits may be the same. For example, semiconductor substrate 202 of FIG. 2 is similar to semiconductor substrate 102 of FIG. 1. In embodiments, the first fill oxide 224 may be deposited via chemical vapor deposition (CVD). In some embodiments, the oxide 224 may be silicon oxide, and may be in the form of a flowable oxide, a high aspect ratio (HARP) oxide, or other suitable oxide. The oxide preferably has good gap fill properties so it can completely fill the shallow trench isolation cavity 117 (FIG. 1) without additional voids.

FIG. 3 shows a semiconductor structure 300 after a subsequent process step of performing an oxide recess in accordance with illustrative embodiments. In some embodiments, a reactive ion etch process may be used to perform the oxide recess. In other embodiments, a wet etch process may be used to perform the oxide recess. The oxide is recessed to a depth D, which is preferably below the level at which stressor regions will be formed. In some embodiments, depth D may range from about 20 nanometers to about 30 nanometers.

FIG. 4 shows a semiconductor structure 400 after a subsequent process step of depositing a high Young's modulus liner 428 on the semiconductor structure, including having the high Young's modulus liner 428 being disposed on the interior surfsace of the shallow trench isolation region. In embodiments, the high Young's modulus (HYM) liner 428 may be comprised of silicon nitride, hafnium oxide, or aluminum oxide. The HYM liner 428 may be deposited via an atomic layer deposition (ALD) process. In embodiments, the HYM liner 428 has a thickness ranging from about 5 nanometers to about 10 nanometers. The HYM liner does not extend to the bottom of the shallow trench isolation cavity (117 of FIG. 1) since the first fill oxide (224 of FIG. 2) is not completely removed prior to deposition of the HYM liner 428. The HYM liner 428 divides the shallow trench isolation into two portions. The oxide region 426 comprises a lower portion of the shallow trench isolation region.

FIG. 5 shows a semiconductor structure 500 after a subsequent process step of depositing a second fill oxide 530 in accordance with illustrative embodiments. In embodiments, the second fill oxide 530 may be similar to that of first fill oxide 224 (see FIG. 2), and may be deposited on top of HYM liner 528 in a similar manner to that of the first fill oxide.

FIG. 6 shows a semiconductor structure 600 after a subsequent process step of planarizing the structure in accordance with illustrative embodiments. In embodiments, the planarizing may be performed with a chemical mechanical polish (CMP) process. The semiconductor structure 600 includes a shallow trench isolation region with a lower portion 626, and an upper portion 630. The lower portion 626 and the upper portion 630 may be comprised of oxide. The HYM liner 628 separates the lower portion 626 and the upper portion 630. Embodiments of the present invention may provide simplified processing because the HYM liner 628 is not deposited to the bottom of the trench. The HYM liner 628 does not compress as much as silicon oxide, which is softer. The HYM liner is stiffer than silicon oxide, which promotes the desired stress. In some embodiments, the high Young's modulus liner has a Young's modulus exceeding 200 GPa (Giga-pascals). In some embodiments, the high Young's modulus liner has a Young's modulus ranging from about 220 GPa to about 400 GPa. In other embodiments, the HYM liner has a Young's modulus ranging from about 240 GPa to about 370 GPa. Embodiments are not limited to a HYM liner with a Young's modulus within these ranges.

FIG. 7 shows a semiconductor structure 700 after a subsequent process step of transistor formation, in accordance with illustrative embodiments. Two transistors, indicated as 704 and 706 are formed on the semiconductor substrate 702. Between transistor 704 and transistor 706 is STI region 705.

Transistor 704 includes gate 712, and embedded stressor source-drain regions 708 and 710. In embodiments, one of the regions may serve as the source of transistor 704, with the other region serving as the drain of transistor 704. In some embodiments, the source-drain regions 708 and 710 may be comprised of epitaxially grown silicon or silicon germanium. Source-drain regions 708 and 710 also serve as embedded stressor regions, such as embedded silicon germanium (SiGe), Stress Memorization Technique (SMT) stressor, or carbon doped Si, inducing a stress in the transistor channel under gate 712 to increase carrier mobility. The gate 712 may be comprised of polysilicon, or may be a metal gate if a replacement metal gate (RMG) process flow is used. Similarly, transistor 706 includes gate 718, and source-drain regions 714 and 716. In embodiments, transistors 704 and 706 are field effect transistors.

An interlevel dielectric layer (ILD) 734 is formed on the structure 700. Contacts (indicated generally as reference 732) may be formed within the ILD 734 to contact the source, drain and gate of transistor 704 and transistor 706. In embodiments, the contacts 732 may be comprised of tungsten. In some embodiments, transistors 704 and 706 may be of an RSD (raised source-drain) variety, and included raised source-drain regions 736.

Referring again to STI region 705, since the HYM liner 728 is adjacent to source-drain regions 710 and 714, it serves to increase volume confinement, and prevents stress relaxation to STI oxide. This aids in creating stacking faults, in the case of an SMT embedded stressor, which induce the desired stress in the channel of transistors 704 and 706, which can improve device performance.

FIG. 8 is a flowchart 800 indicating process steps for embodiments of the present invention. In process step 850, a shallow trench is formed between the two transistors. In process step 852, a first fill oxide is deposited in the trench (see 224 of FIG. 2). In process step 854, the first fill oxide is recessed to a level below the source-drain regions of the transistors (see 326 of FIG. 3). In process step 856, an HYM liner is deposited in the shallow trench isolation region, and is on the sidewalls of the shallow trench, adjacent to where source-drain regions are subsequently formed (see 428 of FIG. 4). In process step 858, a second fill oxide is deposited (see 530 of FIG. 5). In process step 860, the structure is planarized to make the second fill oxide substantially flush with the top of the semiconductor substrate (see 600 of FIG. 6). In process step 862, transistors are formed using industry-standard techniques (see 704 and 706 of FIG. 7). From this point forward, industry standard techniques may be used to complete the integrated circuit, including deposition of interlayer dielectric regions, metallization layers and wiring, and packaging.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor structure comprising:
   a semiconductor substrate;
   a first field effect transistor formed on the semiconductor substrate;
   a second field effect transistor formed on the semiconductor substrate adjacent to the first field effect transistor with a shallow trench isolation (STI) region formed in the semiconductor substrate and disposed between the first field effect transistor and the second field effect transistor, the STI region having been formed using a fill material partially recessed to a depth below the semiconductor substrate; and
   a high Young's modulus liner disposed along a first sidewall of the STI region to the depth below the semiconductor substrate, along a second sidewall of the STI region to the depth below the semiconductor substrate, and along the top portion of the partially recessed fill material.

2. The semiconductor structure of claim 1, wherein the first field effect transistor comprises a first embedded stressor source-drain region, and the second field effect transistor comprises a second embedded stressor source-drain region, and wherein the high Young's modulus liner is in contact with the first embedded stressor source-drain region and the second embedded stressor source-drain region.

3. The semiconductor structure of claim 2, wherein the shallow trench isolation region comprises a lower portion and an upper portion, and wherein the lower portion is filled with oxide, and wherein the upper portion comprises the high Young's modulus liner disposed on an interior surface of the shallow trench isolation region and is filled with oxide.

4. The semiconductor structure of claim 3, wherein the high Young's modulus liner comprises hafnium oxide.

5. The semiconductor structure of claim 3, wherein the high Young's modulus liner comprises aluminum oxide.

6. The semiconductor structure of claim 3, wherein the high Young's modulus liner comprises silicon nitride.

7. The semiconductor structure of claim 3, wherein the high Young's modulus liner has a thickness ranging from about 5 nanometers to about 10 nanometers.

8. The semiconductor structure of claim 3, wherein the high Young's modulus liner has a Young's modulus ranging from about 220 GPa to about 400 GPa.

* * * * *